(12) United States Patent
Baek et al.

(10) Patent No.: US 8,913,453 B2
(45) Date of Patent: Dec. 16, 2014

(54) SEMICONDUCTOR DEVICE AND METHOD OF OPERATING THE SAME

(71) Applicant: SK Hynix Inc., Icheon-si, Gyeonggi-do (KR)

(72) Inventors: Kwang Ho Baek, Hwaseong-si (KR); Jin Su Park, Icheon-si (KR)

(73) Assignee: SK Hynix Inc., Icheon-Si, Gyeonggi-Do (KR)

( * ) Notice: Subject to any disclaimer, the term of this patent is extended or adjusted under 35 U.S.C. 154(b) by 0 days.

(21) Appl. No.: 13/804,490

(22) Filed: Mar. 14, 2013

(65) Prior Publication Data

US 2014/0063950 A1   Mar. 6, 2014

(30) Foreign Application Priority Data

Aug. 29, 2012 (KR) .................. 10-2012-0095107

(51) Int. Cl.
*G11C 7/00* (2006.01)
*G11C 16/26* (2006.01)

(52) U.S. Cl.
CPC .................................. *G11C 16/26* (2013.01)
USPC ................. 365/203; 365/185.11; 365/185.21; 365/196

(58) Field of Classification Search
CPC . G11C 16/26; G11C 16/24; G11C 2029/1204
USPC ..................................................... 365/185.11
See application file for complete search history.

(56) References Cited

U.S. PATENT DOCUMENTS

2006/0083071 A1* 4/2006 Nagashima .............. 365/185.28
2013/0315003 A1* 11/2013 Lee .......................... 365/185.22

FOREIGN PATENT DOCUMENTS

KR   1020100113768   10/2010
KR   1020110043211    4/2011

* cited by examiner

*Primary Examiner* — Anthan Tran
(74) *Attorney, Agent, or Firm* — Lowe Hauptman & Ham, LLP

(57) ABSTRACT

A semiconductor device including a memory block, which includes memory cells coupled to bit lines. The semiconductor device further includes a first sensing circuit coupled to an even bit line and configured to sense current flow through the even bit line in response to an even bit line control signal and an even discharge signal. The semiconductor device further includes a second sensing circuit coupled to an odd bit line and configured to sense current flow through the odd bit lines in response to an odd bit line control signal and an odd discharge signal. The first sensing circuit and second sensing circuit are configured to supply a ground voltage to the odd bit line when sensing the current flow through the even bit line, and to supply the ground voltage to the even bit line when sensing the current flow through the odd bit line.

14 Claims, 9 Drawing Sheets

SEMICONDUCTOR DEVICE AND METHOD OF OPERATING THE SAME

CROSS-REFERENCE TO RELATED APPLICATION

This application is based on and claims priority from Korean Patent Application No. 10-2012-0095107, filed on Aug. 29, 2012, with the Korean Intellectual Property Office, the disclosure of which is incorporated herein in its entirety by reference.

FIELD

This description relates to a semiconductor device and a method of operating the same, and more particularly, to a semiconductor device performing a sensing operation, and a method of operating the same.

BACKGROUND

A NAND flash memory device performs an erase operation in the unit of a memory block, and performs a program operation and a read operation in the unit of a page. In some instances, bit lines connected with memory cells are divided into even bit lines and odd bit lines. In this case, the memory cells connected to the even bit lines configure an even page, and the memory cells connected to the odd bit lines configure an odd page. When a page is divided into the even page and the odd page, a size of the page is also decreased to a half size.

A large page size is advantageous in terms of sequential performance. In contrast, a small page size is advantageous in terms of random performance.

SUMMARY

One aspect of this description relates to a semiconductor device including a memory block, the memory block includes memory cells coupled to bit lines. The semiconductor device further includes a first sensing circuit coupled to an even bit line among the bit lines and configured to sense current flow through the even bit line in response to an even bit line control signal and an even discharge signal. The semiconductor device further includes a second sensing circuit coupled to an odd bit line among the bit lines and configured to sense current flow through the odd bit lines in response to an odd bit line control signal and an odd discharge signal. The first sensing circuit and second sensing circuit are configured to supply a ground voltage to the odd bit line when sensing the current flow through the even bit line, and to supply the ground voltage to the even bit line when sensing the current flow through the odd bit line.

Another aspect of this description relates to a method of operating a semiconductor device. The method includes discharging odd bit lines of odd memory cells among memory cells connected between a source line and bit lines. The method further includes performing a first sensing operation for sensing current flow to the source line from even bit lines of even memory cells among the memory cells. The method further includes discharging the even bit lines of the even memory cells. The method further includes performing a second sensing operation for sensing current flow to the source line from the odd bit lines of odd memory cells among the memory cells.

One of ordinary skill in the art would understand the foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Figure 1:
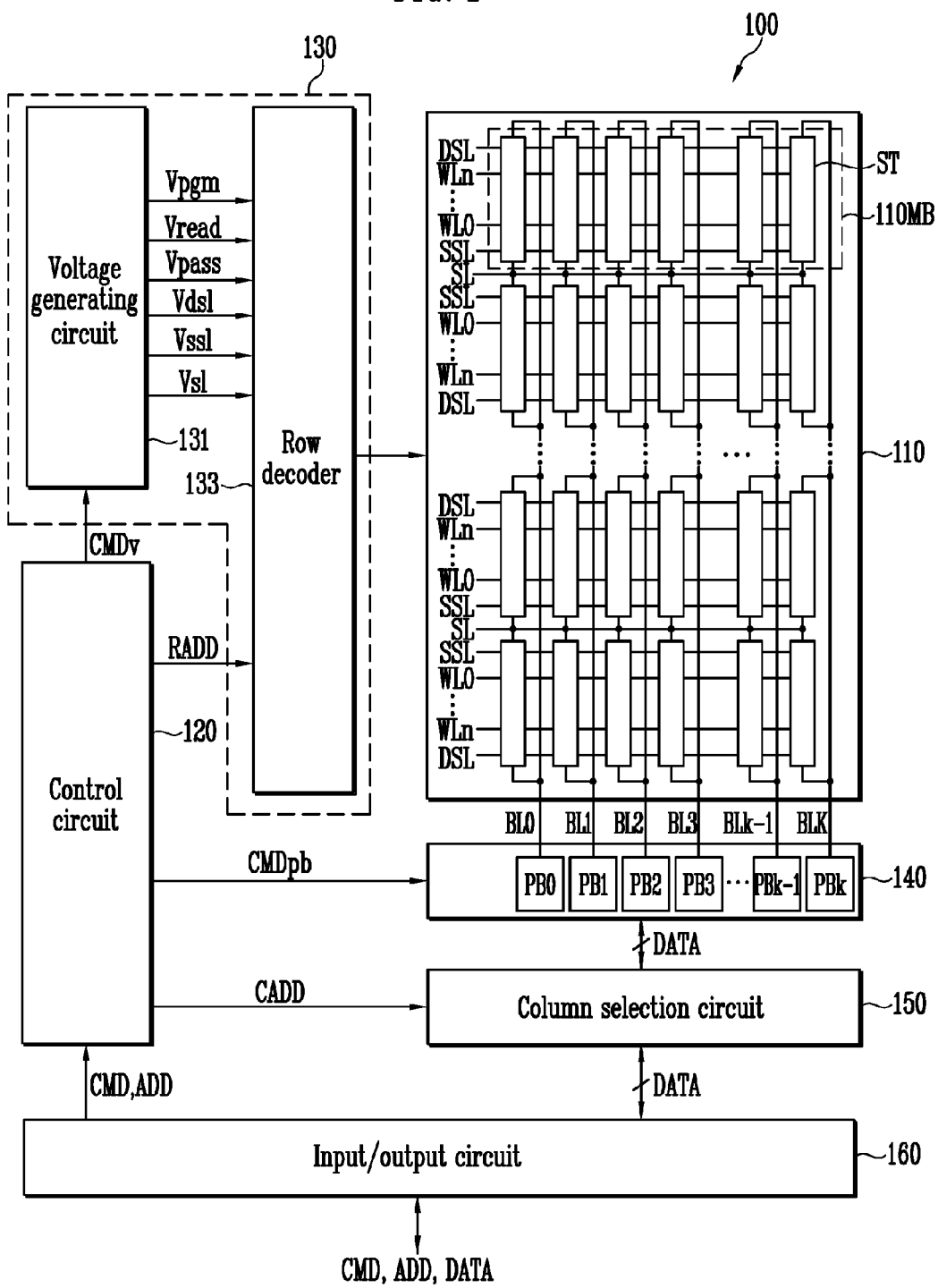
FIG. 1 is a block diagram of a semiconductor device according to at least one embodiment.

The following description makes reference to the accompanying drawings in detail. However, one of ordinary skill in the art will understand the following description is not limited to the embodiments specifically disclosed below and is implemented in various forms and the scope of the following description is not limited to the following embodiments. FIG. 1 is a block diagram of a semiconductor device 100 according to at least one embodiment.

Referring to FIG. 1, the semiconductor device 100 includes a memory array 110 and peripheral circuits 120 to 160. The peripheral circuits include a control circuit 120 and operation circuits 130 to 160. In some embodiments where the semiconductor device 100 is a flash memory device, the operation circuits include a voltage supplying circuit 130, a sensing circuit group 140, a column selection circuit 150, and an input/output circuit 160.

The memory array 110 includes a plurality of memory blocks 110 MB. Each memory block 110 MB may include a plurality of memory strings ST. A structure of the memory block 110 MB is described below.

Figure 2:
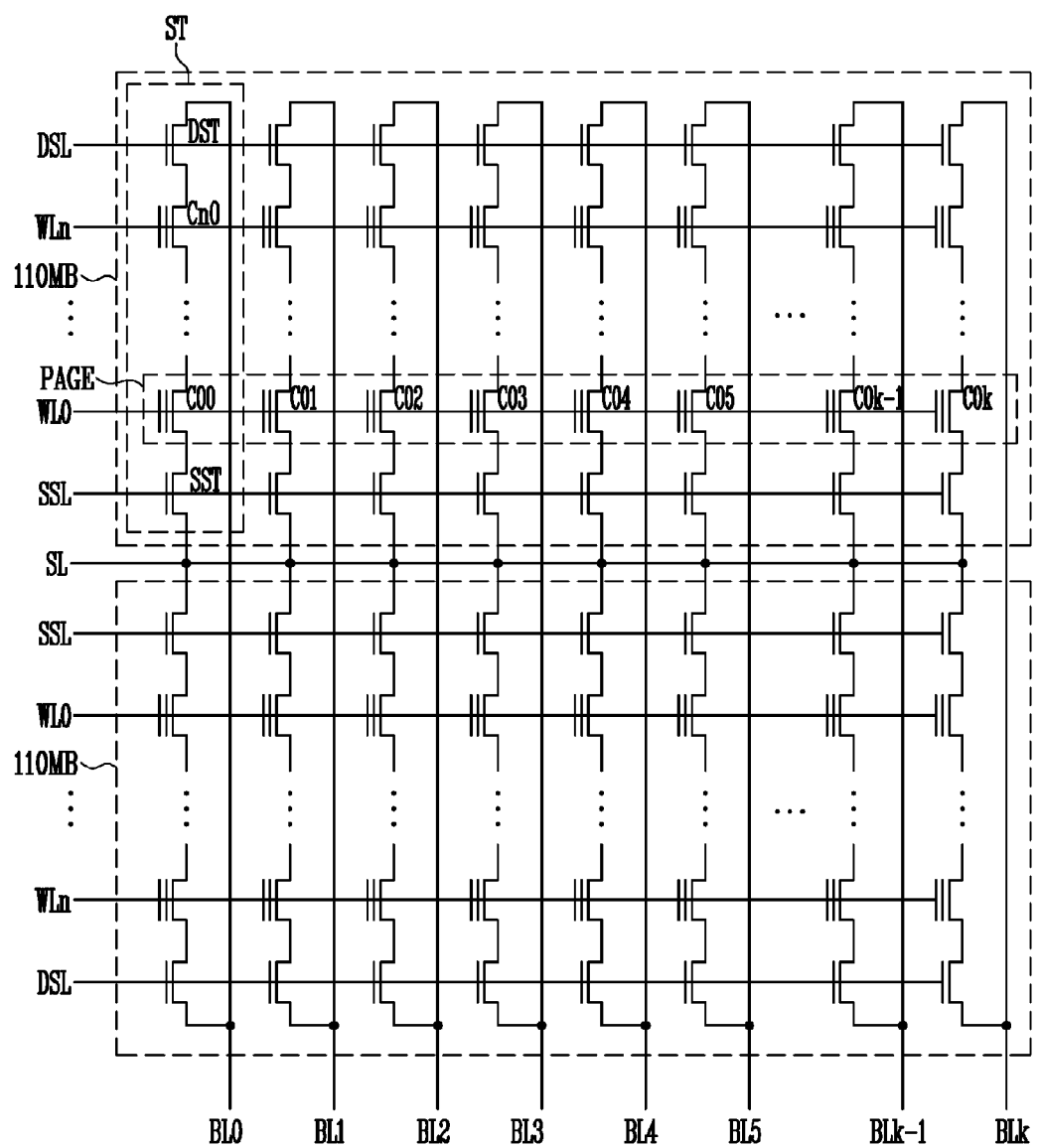
FIG. 2 is a circuit diagram of two memory blocks of FIG. 1 according to at least one embodiment.

FIG. 2 is a circuit diagram of the memory blocks 110 MB of FIG. 1 according to at least one embodiment.

Referring to FIG. 2, each memory block 110 MB includes a plurality of memory strings ST, each memory string ST of the plurality of memory strings connected between a respective bit lines BL0 to BLk and a common source line SL. That is, each memory strings ST is connected to the bit lines BL0 to BLk, respectively, and are commonly connected to the common source line SL.

Each memory string ST includes a source select transistor SST, in which a source of the source select transistor is connected to the common source line SL. Each memory string ST further includes a cell string in which a plurality of memory cells C00 to Cn0 is connected in series. Each memory string ST also includes a drain select transistor DST, in which a drain of the drain select transistor is connected to the respective bit line BL0 to BLk. The memory cells C00 to Cn0 included in the cell string are connected in series between the source select transistors SST and the drain select transistors DST. A gate of the source select transistor SST is connected to a source select line SSL, gates of the memory cells C00 to Cn0 are connected to the word lines WL0 to WLn, respectively, and a gate of the drain select transistor DST is connected to a drain select line DSL.

Herein, the drain select transistor DST selectively connects the cell strings C00 to Cn0 and the bit line BL0 to BLk. The source select transistor SST selectively connects the cell strings C00 to Cn0 and the common source line SL.

In a NAND flash memory device, the memory cells included in the memory cell block may be divided in the unit of a physical page or a logical page. For example, the memory cells C00 to C0$k$ connected to one word line (for example, the word line WL0) configures one physical page PAGE. Further, even-numbered memory cells Ce00, C02, C0$k$–1 connected to one word line (For example, the word line WL0) may configure one even physical page, and odd-numbered memory cells C01, C03, and C0$k$ may configure one odd physical page. The page (or the even page and the odd page) serves as a basic unit for a program operation or a read operation.

Referring to FIGS. 1 and 2 again, the peripheral circuits 120 to 160 are configured to as to perform an erase loop, a program loop, and a read operation of the memory cells C00 to C0$k$ connected to the selected word line (for example, the word line WL0). The peripheral circuits include the control circuit 120 for controlling the program loop, the read loop, and the erase operation, and the operation circuits 130 to 160 configured so as to perform the program loop, the read loop, and the erase operation according to the control of the control circuit 120. In order to perform the program loop, the read loop, and the erase operation, the operation circuit 130 is configured to selectively output operation voltages Vgpm, Vread, Vpass, Vdsl, Vssl, and Vsl to the local lines SSL, WL0 to WLn, and DSL of the memory block and the common source line SL, control precharge/discharge of the bit lines BL0 to BLk or sense current flow through the bit lines BL0 to BLk. In some embodiments where the semiconductor device 100 is a NAND flash memory device, the operation circuits include the voltage supplying circuit 130, the sensing circuit group 140, the column selection circuit 150, and the input/output circuit 160. The respective constituent elements will be described in detail below.

The control circuit 120 outputs a voltage control signal CMDv for controlling the voltage supplying circuit 130 so that the voltage supplying circuit generates voltages Vgpm, Vread, Vpass, Vdsl, Vssl, and Vsl at a desired voltage level. Further, the control circuit 120 outputs control signals CMDpb for controlling sensing circuits PB0 to PBk included in the sensing circuit group 140 in order to perform the program loop, the read operation, or the erase loop. Further, when an address signal ADD is input from the input/output circuit 160, the control circuit 120 generates a column address signal CADD and a row address signal RADD based on the address signal and outputs the generated signals to the column selection circuit 150 and the voltage supplying circuit 130, respectively.

The voltage supplying circuit 130 generates the operation voltages Vgpm, Vread, Vpass, Vdsl, Vssl, and Vsl according to the program loop, the read operation, or the erase loop of the memory cells in response to the voltage control signal CMDv from the control circuit 120, and outputs the operation voltages to the local lines SSL, WL0 to WLn, and DSL of the selected memory block and the common source line SL in response to the row address signal RADD from the control circuit 120.

To this end, the voltage supplying circuit 130 includes a voltage generating circuit 131 and a row decoder 131, in some embodiments. The voltage generating circuit 131 generates the operation voltages Vgpm, Vread, Vpass, Vdsl, Vssl, and Vsl in response to the voltage control signal CMDv from the control circuit 120, and the row decoder 133 transmits the operation voltages to the local lines SSL, WL0 to WLn, and DSL of the selected memory block among the memory blocks 110 MB and the common source line SL in response to the row address signal RADD from the control circuit 120.

As described above, the output and the change of the operation voltages Vgpm, Vread, Vpass, Vdsl, Vssl, and Vsl to be described below are performed by the voltage supplying circuit 130 according to the voltage control signal CMDv from the control circuit 120.

The sensing circuit groups 140 includes a plurality of sensing circuits PB0 to PBk connected with the memory array 110 through the bit lines BL0 to BLk, respectively. The sensing circuits PB0 to PBk selectively precharge the bit lines BL0 to BLk according to the operation control signal CMDpb of the control circuit 120 and data DATA to be stored in the memory cells of the memory array 110 at the time of the program operation. In some embodiments, data DATA is received from the column selection circuit 150. The sensing circuits PB0 to PBk precharge the bit line BL0 to BLk and then latch the data read from the memory cell of the memory array 110 by sensing the current flow through the bit lines BL0 to BLk according to the operation control signal CMDpb of the control circuit 120 in a program verification operation or the read operation.

The column selection circuit 150 selects the sensing circuits PB0 to PBk included in the sensing circuit group 140 in response to the column address CADD output from the control circuit 120. That is, the column selection circuit 150 sequentially transmits data to be stored in the memory cells of the memory array 110 to the sensing circuits PB0 to PBk in response to the column address CADD. Further, the column selection circuit 150 sequentially selects the sensing circuits PB0 to PBk in response to the column address CADD so that the data of the memory cells of the memory array 110 latched in the sensing circuits PB0 to PBk by the read operation output to external circuitry.

The input/output circuit 160 transmits the command signal CMD and the address signal ADD input from the external circuitry to the control circuit 120. Further, the input/output circuit 160 transmits the data DATA input from the external circuitry to the column selection circuit 150 during the program operation or performs an operation of outputting the data read from the memory cells of the memory array 110 to the external circuitry during the read operation.

Hereinafter, a connection relation between the sensing circuits PB0 to PBk and the bit lines BL0 to BLk will be described in more detail below.

Figure 3A:
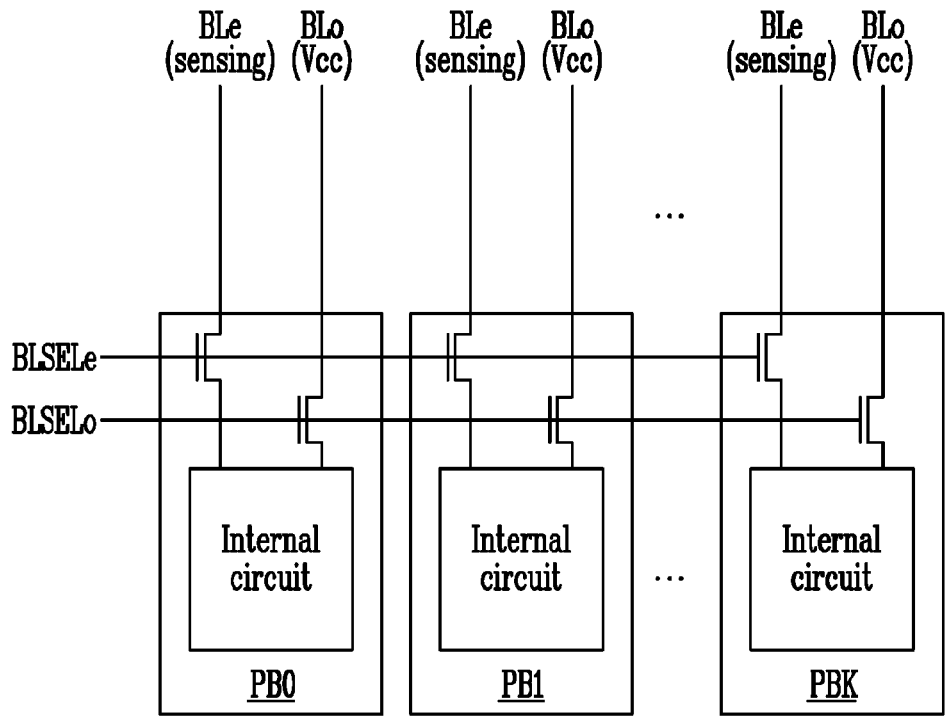
FIGS. 3A to 3C are diagrams of a connection relation between bit lines and sensing circuits according to at least one embodiment.
Figure 3B:
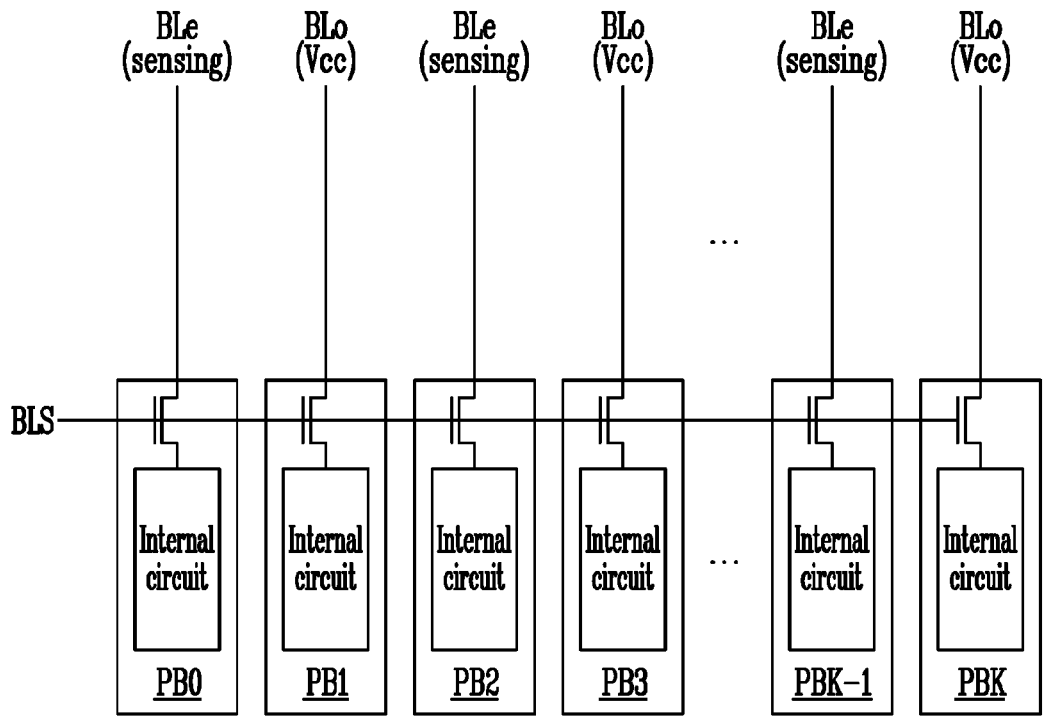
Figure 3C:
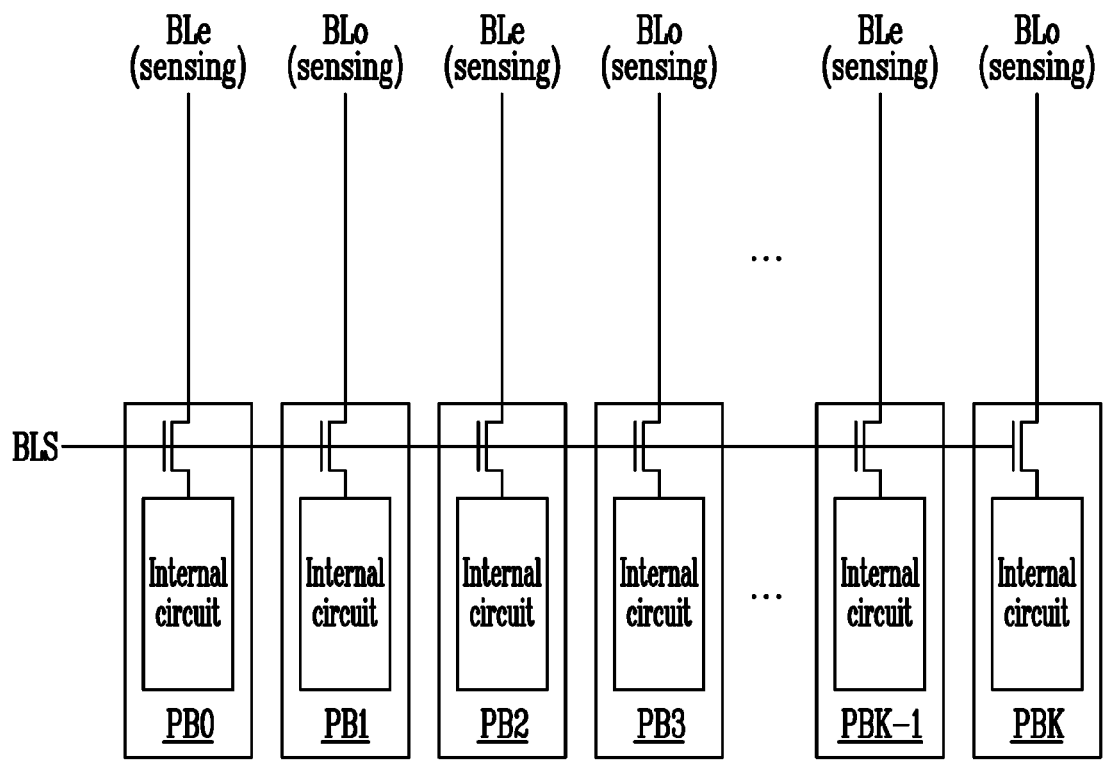

FIGS. 3A to 3C are diagrams of a connection relation between the bit lines and the sensing circuits according to at least one embodiment.

Referring to FIG. 3A, each of the sensing circuits PB0 to PBk is connected to a pair of bit lines including an even bit line BLe and an odd bit line BLo. In some embodiments, the sensing circuits PB0 to PBk is selectively connected to the even bit line BLe or the odd bit line BLo in response to an even bit line selection signal BLSELe and an odd bit line selection signal BLSELo. In an even odd bit line (EOBL) connection structure, the program operations or the read operations of even memory cells and odd memory cells are separately performed. That is, the even page and the odd page serve as a basic unit of the program operation and the read operation. Accordingly, in order to read data stored in the even memory cells and the odd memory cells connected to one word line, two read operations (even read operation and odd read operation) are performed.

In the EOBL structure, the read operation is performed by a voltage sensing method. For example, when the read operation of the even page is performed, the sensing circuits PB0 to PBk are connected to the even bit lines BLe in response to the even bit line selection signal BLSELe, and the sensing circuits PB0 to PBk precharge the even bit lines BLe and then sense a voltage change of the even bit lines BLe. In some embodiments, a power source voltage Vcc is supplied to the non-selected odd bit lines BL0.

Referring to FIG. 3B, each of the sensing circuits PB0 to PBk is connected to an entire bit line, e.g., the even bit lines BLe or the odd bit lines BLo. In some embodiments, the sensing circuits PB0 to PBk are connected to the bit lines BLe and BLo in response to a bit line connection signal BLS. In an all bit line (ABL) connection structure, the program operation of the even memory cells and the odd memory cells are performed simultaneously. That is, all pages including the even page and the odd page serve as a basic unit of the program operation. Accordingly, a page size in the EOLB structure is smaller than that of the ABL structure, and corresponds to a half of that of the ABL structure.

The read operation in the ABL structure is performed by a voltage sensing method or a current sensing method, in some embodiments. An internal structure and an operation method of the sensing circuit are changed according to the sensing method. However, when the sensing circuit is operated by the voltage sensing method in the ABL structure, data of the even memory cells and the odd memory cells are not simultaneously read, so that the read operations of the even memory cells and the odd memory cells are separately performed. Accordingly, in order to read the data stored in the even memory cells and the odd memory cells connected to the single word line, the two read operations (the even read operation and the odd read operation) are performed.

For example, when the read operation of the even page is performed, the sensing circuits PB0 to PBk precharge the even bit lines BLe and then sense the voltage change of the even bit lines BLe. In some embodiments, the power source voltage Vcc is fixedly supplied to the non-selected odd bit lines BLo.

Referring to FIG. 3C, in some embodiments, when the sensing circuits PB0 to PBk are operated by the current sensing method in the ABL structure, the sensing circuits PB0 to PBk are simultaneously read the data of the even memory cells and the odd memory cells by sensing current flow of the bit lines BL0 to BLk while supplying current to the bit lines BL0 to BLk. Accordingly, the read operations of the even memory cells and the odd memory cells are simultaneously performed.

However, when the sensing operation is performed, a large quantity of current flows through memory cells (the cells in an erased state) having a low threshold voltage, and a voltage on a source line is increased due to large quantity of current and resistance of the source line. In some embodiments, a characteristic of the sensing operation deteriorates and causes an error due to a source bouncing phenomenon. Accordingly, the sensing circuits PB0 to PBk initially perform the sensing operation for detecting the memory cells having high cell current (for example, the cells in the erased state), and then perform the sensing operation for sensing the remaining cells. As a result, a time of the read operation is increased.

Figure 4:
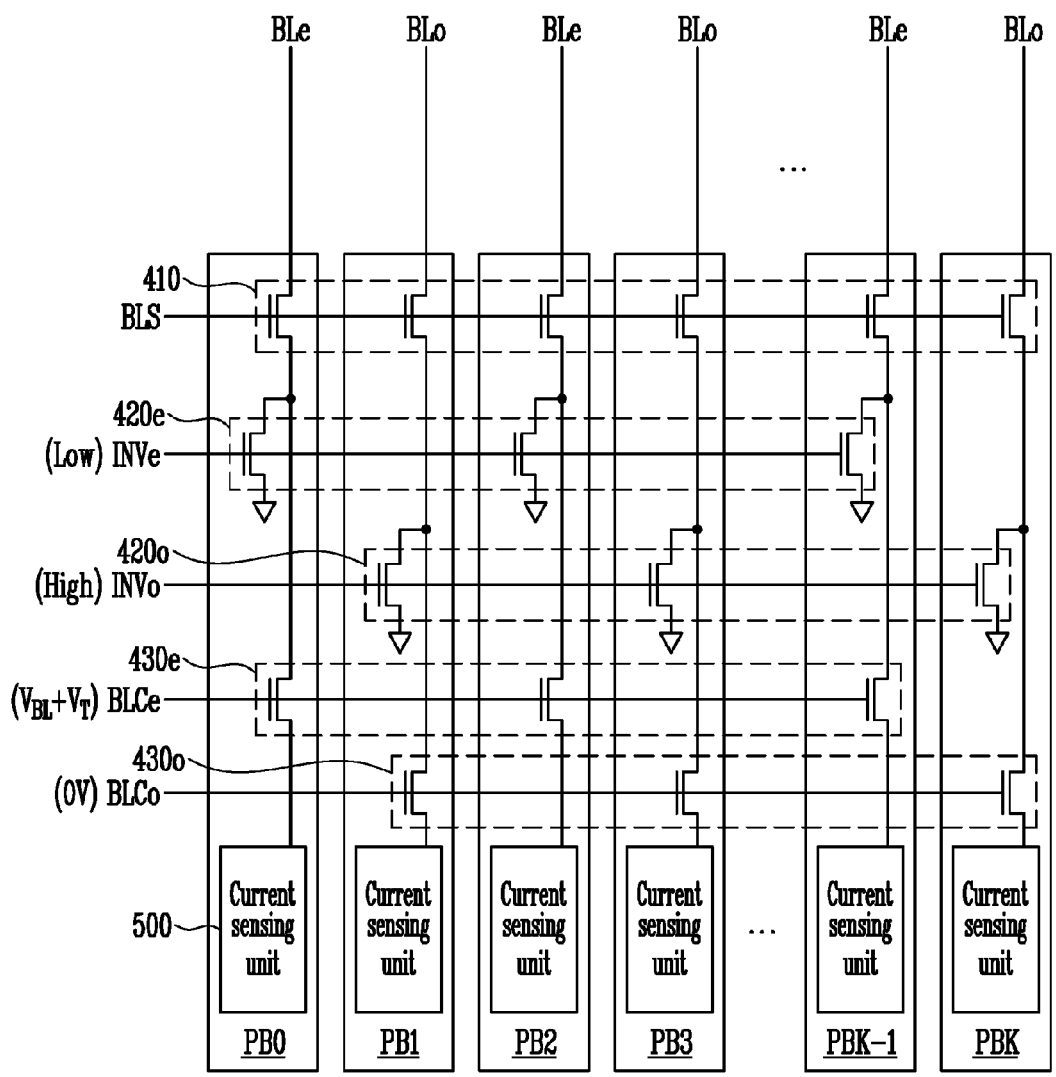
FIG. 4 is a diagram of a connection relation between bit lines and sensing circuits according to at least one embodiment.

FIG. 4 is a diagram for describing a connection relation between the bit lines and the sensing circuits according to at least one embodiment.

Referring to FIG. 4, each of the sensing circuits PB0 to PBk is connected to a bit line BL0 to BLk and is configured to be operated by the current sensing method of sensing current flow through the bit line. First sensing circuits PB0, PB2, and PBk-1 are connected to the even bit lines BLe. Each of the first sensing circuits includes a bit line clamp circuit 430e, a discharge circuit 420e, and a current sensing unit 500.

The bit line clamp circuit 430e is configured to control a voltage of the even bit line BLe in response to an even bit line control signal BLCe. In some embodiments, the bit line clamp circuit 430e includes a transistor T3 operated in response to the even bit line control signal BLCe. The discharge circuit 420e is configured to discharge the even bit line BLe in response to an even discharge signal INVe. In some embodiments, the discharge circuit 420e includes a transistor T2 operated in response to the even discharge signal INVe. The current sensing unit 500 is configured to precharge the even bit line BLe, or supply current and sense current flow through the even bit line BLe.

In some embodiments, the first sensing circuits, e.g. PB0, further include an activation control circuit 410 for activating the first sensing circuit PB0 in response to an activation signal BLS. The activation control circuit 410 further includes a transistor T1 operated in response to the activation signal BLS. That is, the activation control circuit 410 electrically connects the first sensing circuit PB0 and the even bit line BLe in response to the activation control signal BLS.

Second sensing circuits PB1, PB3, and PBk are connected with the odd bit lines BLo and have a similar configuration as that of the first sensing circuits PB0, PB2, and PBk-1. The second sensing circuits include a bit line clamp circuit 430o operated in response to an odd bit line control signal BLCo. The second sensing circuits further include a discharge circuit 420o operated in response to an odd discharge signal INVo.

The second sensing circuits supply a ground voltage to the odd bit lines BLo in order to use the odd bit lines BLo as shielding lines for the even bit lines BLe when sensing the current flow through the even bit lines BLe. The first sensing circuits supply a ground voltage to the even bit lines in order to use the even bit lines BLo as shielding lines for the odd bit lines BLo when sensing the current flow through the odd bit lines BLo.

A configuration of the current sensing unit 500 is described in more detail below.

Figure 5:
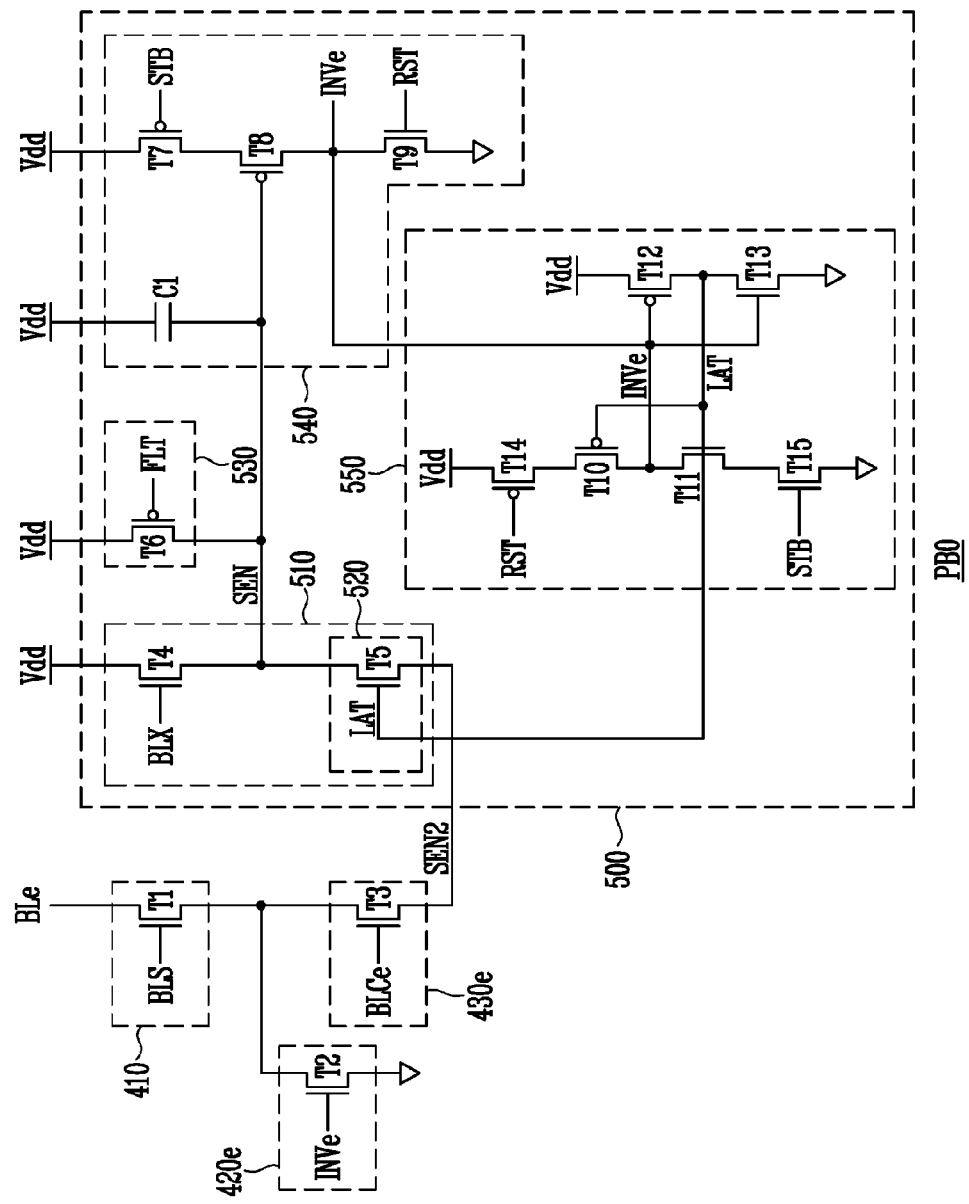
FIG. 5 is a circuit diagram of the sensing circuit of FIG. 4 according to at least one embodiment.

FIG. 5 is a circuit diagram of the sensing circuit PB0 of FIG. 4 according to at least one embodiment.

Referring to FIG. 5, the sensing circuit PB0 includes the aforementioned activation control circuit 410, the discharge circuit 420e, the bit line clamp circuit 430e, and the current sensing unit 500. The current sensing unit 500 included in the first sensing circuit, e.g., PB0, and the current sensing unit 500 included in the second sensing circuit, e.g. PB1, have a similar configuration, but signals input in the current sensing unit included in the first sensing circuit and the current sensing unit included in the second sensing circuit are different, in some embodiments.

In some embodiments, the current sensing unit 500 includes a clamp circuit 510, an isolation circuit 520, a precharge circuit 530, a current determination circuit 540, and a latch circuit 550.

The clamp circuit 510 includes a transistor T4 connected between a power voltage terminal and a first sensing node SEN and is operated in response to a clamp signal BLX. The isolation circuit 520 includes a transistor T5 connected between the first sensing node SEN and a second sensing node SEN2 and is operated by an isolation signal LAT. A connection node of the isolation circuit 520 and the bit line clamp circuit 430e is the second sensing node SEN2. The precharge circuit 530 includes a transistor T6 connected between the power voltage terminal and the first sensing node SEN and is operated in response to a precharge signal FLT.

The current determination circuit 540 includes a capacitor C1 connected between the power voltage terminal and the first sensing node SEN. The current determination circuit 540 includes a transistor T8 operated by a potential determined according to a quantity of current of the first sensing node SEN, and a transistor T7 connected between the power voltage terminal and the transistor T8. The transistor T7 is operated in response to a strobe signal STB, and a transistor T9 connected between a ground voltage terminal and the transistor T8 and operated in response to a reset signal RST. A signal at a connection node of the transistors T8 and T9 is used as the discharge signal INVe, which is used to operate discharge circuit 420e.

The latch circuit 550 includes transistors T10 and T11 configured as a first inverter, and transistors T12 and T13 configured as a second inverter. The latch circuit 550 includes a transistor T14 connected between the power voltage terminal and the transistor T10 in the first inverter and operated in response to the reset signal RST. The latch circuit 550 further includes a transistor T15 connected between the ground voltage terminal and the transistor T11 and operated in response to the strobe signal STB. An output node of the first inverter T10 and T11 is connected to a first input node of the second inverter T12 and T13, and an output node LAT of the second inverter T12 and T13 is connected to a first input node of the first inverter T10 and T11. The first input node of the first inverter T10 and T11 is connected to an input node of the isolation circuit 52 and the output does of the second inverter T12 and T13. Further, a second input node of the second inverter T12 and T13 is connected to the connection node of the transistors T8 and T9. That is, a first signal among signals output from the latch circuit 550 is used as the discharge signal INVe, and a second signal is used as the isolation signal LAT of the isolation circuit 520, in some embodiments.

Hereinafter, an operation of the sensing circuit including the aforementioned configurations is described.

Figure 6:
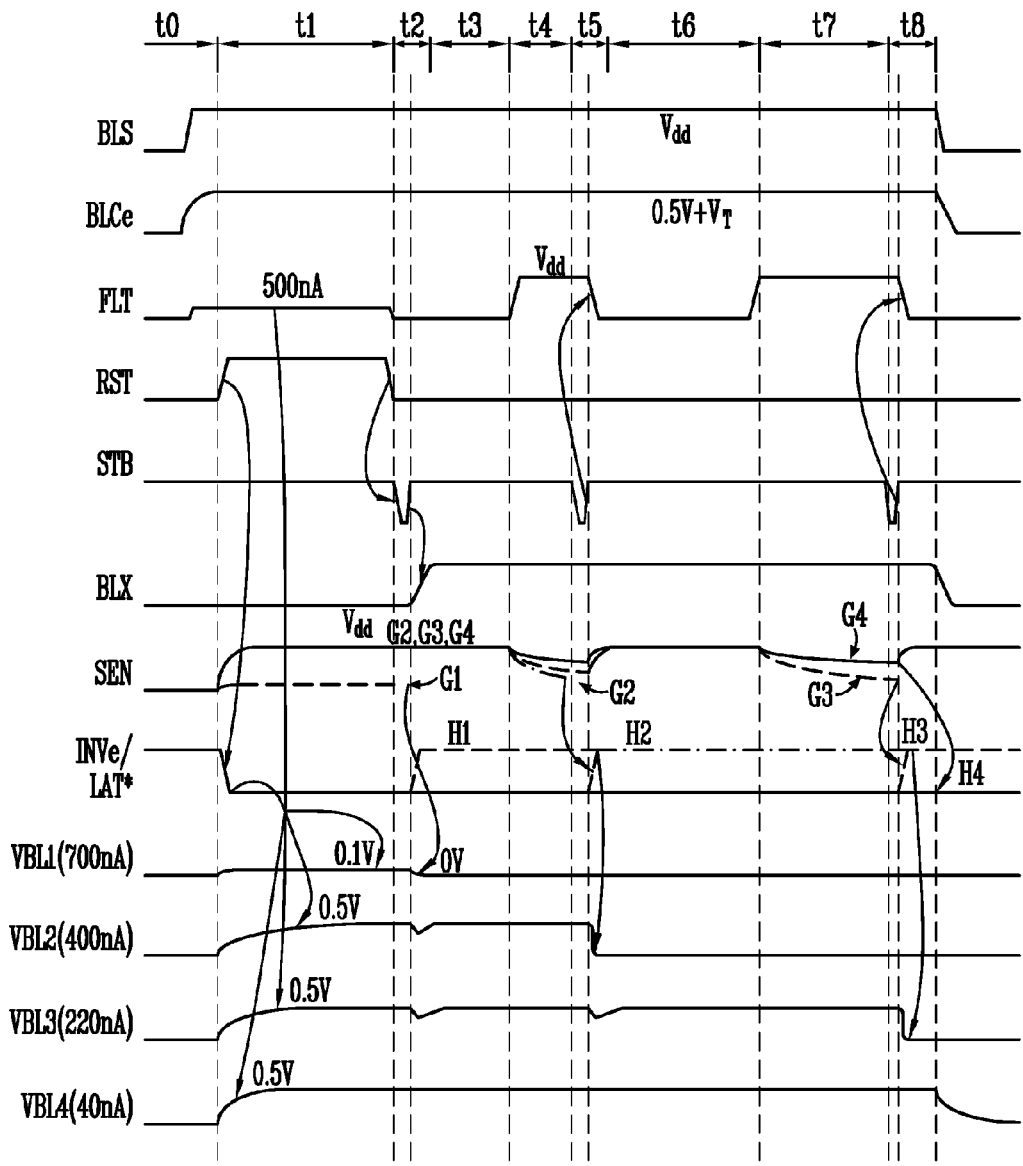
FIG. 6 is a waveform diagram of an operation of the sensing circuit of FIG. 5 according to at least one embodiment.

FIG. 6 is a waveform diagram of an operation of the sensing circuit of FIG. 5 according to at least one embodiment.

Referring to FIGS. 5 and 6, a set-up operation is performed at time t0. The first sensing circuit PB0 is connected to the even bit line BLe by activation control circuit 410 according to the activation control signal BLS. The discharge circuit 420e is non-activated in response to the even discharge signal INVe. The clamp circuit 430e is activated in response to the even bit line control signal BLCe. The precharge circuit 530 is activated as a current source in response to the precharge signal FLT.

In some embodiments, the odd bit lines are discharged and serve as the shielding lines of the even bit lines BLe according to the activation of the discharge circuit 420o by the odd discharge signal INVo in the second sensing circuit connected with the odd bit lines.

Next, a first precharge operation is performed at time t1. First, the current sensing unit 500 is initialized by the reset signal RST. The transistor T9 is activated by the reset signal RST connecting the connection node to the ground voltage terminal. The transistor T12 is activated in response to the discharge signal INVe being pulled to a low logic level, which connects the power voltage terminal to the output of the second inverter T12 and T13. Accordingly, the isolation signal LAT transitions to a high logic level, which activates the transistor T5 of the isolation circuit 520. The first sensing node SEN and the second sensing node SEN2 are electrically connected by the activation of the transistor T5. The precharge circuit 530 precharges the first sensing node SEN and the second sensing node SEN2 in response to the precharge signal FLT.

For reference, VLB1 indicates a voltage of the bit line connected with a first memory cell having conductive current of 700 nA, VLB2 indicates a voltage of the bit line connected with a second memory cell having conductive current of 400 nA, VLB3 indicates a voltage of the bit line connected with a third memory cell having conductive current of 220 nA, and VLB4 indicates a voltage of the bit line connected with a fourth memory cell having conductive current of 40 nA. Here, the high conductive current means that a quantity of current flowing through the memory cell is high due to a low threshold voltage of the memory cell. For reference, a value of the conductive current is changed, in some embodiments. For example, the first memory cell having the conductive current of 700 nA may correspond to a memory cell in the erased state.

The precharge circuit 530 supplies a current of 500 nA in order to discriminate a memory cell having the highest conductive current from other memory cells of memory array 110. As a result, the voltage VBL1 on the bit line of the first memory cell becomes 0 V, and the voltages VBL2, VBL3 and VBL4 on the bit lines of the remaining memory cells are increased to a voltage (for example, 0.5 V) set by the clamp circuit 430e.

Next, a first latch operation is performed at time t2. When the voltage VBL1 on the bit line becomes 0 V by the first memory cell, a level of the first sensing node SEN of a sensing circuit connected to the first memory cell becomes 0 V. The first sensing node SEN being 0V activate the transistor T8. When the strobe signal STB is activated with a low logic level, the transistor T7 is also activated, thereby connecting the connection node to the power terminal. As a result, the signal INVe is input in the latch circuit 550 with a high logic level. Accordingly, the current flow of the bit line is sensed. In some embodiments, the bit line BLe and the first sensing node SEN are connected. In some embodiments, the bit line is discharged by the signal INVe. That is, the current flow for the bit line of the first memory cell is no longer sensed.

Since the voltage VBL2, VBL3 and VBL4 on the bit line BLe is increased to 0.5 V in the sensing circuit of the remaining second to fourth memory cells, a voltage of the first sensing node SEN is logically high, so that the transistor T8 is non-activated. Accordingly, the latch circuit 550 is not changed in an initialization state.

Accordingly, since the first memory cell having the highest conductive current is detected and the sensing operation is no longer performed, a quantity of current flowing from the bit lines to the source line is decreased during the sensing operation of the remaining second to fourth memory cells. The decreased current suppresses a source bouncing phenomenon and improves an operation characteristic of the sensing operation.

Next, a first restoration/precharge operation is performed at time t3. In some embodiments, the precharge circuit 530 precharges the first sensing node SEN to a level of the power source voltage Vdd in response to the precharge signal FLT.

Next, a first sensing operation is performed at time t4. The first sensing operation is performed for a first duration in order to detect data stored in the second memory cell having the conductive current of 400 nA. The first duration is set to a duration for which current of approximately 300 nA is supplied from the sensing node connected with the capacitor C1 to the bit line, in some embodiments. As a result, the current of 300 nA supplied to the bit line of the second memory cell is all discharged to the source line through the second memory cell having the conductive current of 400 nA. Accordingly, the voltage VBL2 on the bit line BLe of the second memory cell becomes 0 V. The bit lines of the remaining third and fourth memory cells maintain 0.5 V.

Next, a second latch operation is performed at time t5. The second latch operation is similar to the first latch operation performed at time t2.

Next, a second restoration/precharge operation is performed at time t6. The second restoration/precharge operation is similar to the first restoration/precharge operation performed at time t3.

Next, a second sensing operation is performed at time t7. The second sensing operation is performed for a second duration in order to detect the data stored in the third memory cell having the conductive current of 200 nA. The second duration is set to a duration for which current of approximately 100 nA is supplied from the sensing node connected with the capacitor C1 to the bit line, in some embodiments. As a result, the current of 100 nA supplied to the bit line of the third memory cell is discharged to the source line through the third memory cell having the conductive current of 220 nA. Accordingly, the voltage of the bit line BLe of the third memory cell becomes 0 V. The bit line of the remaining fourth memory cell maintains 0.5 V.

Next, after the third latch operation is performed at time t8, data latched in the latch circuit 550 is output.

When the sensing operation of the even bit lines are completed, the ground voltage is supplied to the even bit lines, and the aforementioned method is applied to the sensing operation of the odd bit line. The sensing operation of the odd bit line is performed before the data of the even memory cells is output, and the sensed data of the even memory cells and the sensed data of the odd memory cells are simultaneously output, in some embodiments.

The aforementioned sensing operation may be generally divided into the first sensing operation for detecting the first memory cell having the highest conductive current, and the second sensing operation for detecting the remaining cells. The first sensing operation is first performed in order to prevent source bouncing from being generated due to simultaneous flow of the high current to the source line. To prevent source bouncing, the sensing operation is performed twice. However, when the odd bit lines are discharged and the sensing operation of only the even bit lines is performed, decreasing the quantity of current flowing to the source line to a half is possible, so that the source bounding is negligible, in some embodiments.

Further, when the sensing operations are simultaneously performed for all bit lines, a voltage of a bit line adjacent to the sensed bit line, of which the voltage is decreased, is decreased by a capacitor coupling phenomenon, so the aforementioned restoration/precharge operation is used. However, in some embodiments, the ground voltage is supplied to the odd bit line and the odd bit line is used as the shielding line for the even bit line, so the capacitor coupling phenomenon between the adjacent bit lines is decreased. Accordingly, in some embodiments, the restoration/precharge operation is omitted and an operation time is decreased.

In addition, since the semiconductor device is operated by the current sensing method in the ABL structure, the size of the page is not decreased and it is possible to improve a random performance characteristic is improved, in some embodiments.

Figure 7:
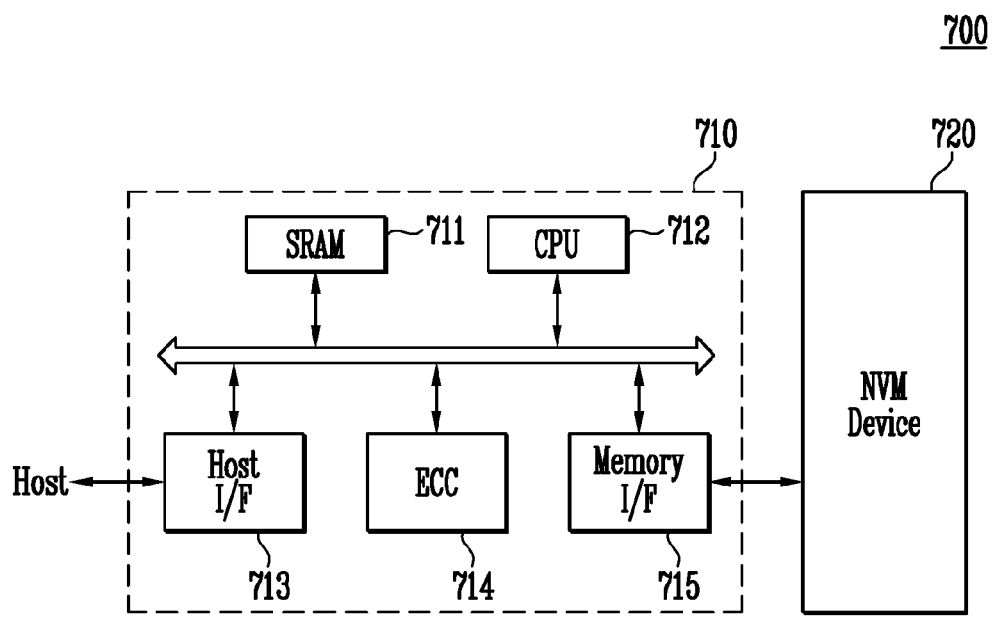
FIG. 7 is a schematic block diagram of a memory system according to at least one embodiment.

FIG. 7 is a schematic block diagram of a memory system according to at least one embodiment.

Referring to FIG. 7, a memory system 700 according to at least one embodiment of the present invention includes a non-volatile memory device 720 and a memory controller 710, in some embodiments.

The non-volatile memory device 720 may include the aforementioned semiconductor device 100, in some embodiments. The memory controller 710 is configured to control the non-volatile memory device 720. A memory card or a semiconductor disk device (e.g., Solid State Disk: SSD) may be provided by a combination of the non-volatile memory device 720 and the memory controller 710. A static random access memory (SRAM) 711 is used as an operation memory of a processing unit 712. A host interface 713 includes a data exchange protocol of a host accessing the memory system 700. An error correction block 714 detects and corrects an error included in data read from the non-volatile memory device 720. A memory interface 715 interfaces with the non-volatile memory device 720. The processing unit 712 performs a general control operation for data exchange of the memory controller 710.

In some embodiments, the memory system 700 further includes a read only memory (ROM) (not illustrated) for storing code data for interfacing with the host. The non-volatile memory device 720 is provided as a multi-chip package including a plurality of flash memory chips, in some embodiments. The memory system 700 is provided as a storage medium with high reliability having a low error generation probability, in some embodiments. Especially, the flash memory device is included in a memory system, such as the semiconductor disk device (Solid State Disk: SSD). In some embodiments, the memory controller 710 communicates with an external device (for example, a host) through one of various interface protocols, such as USB, MMC, PCI-E, SATA, PATA, SCSI, ESDI, and IDE or other suitable protocols.

Figure 8:
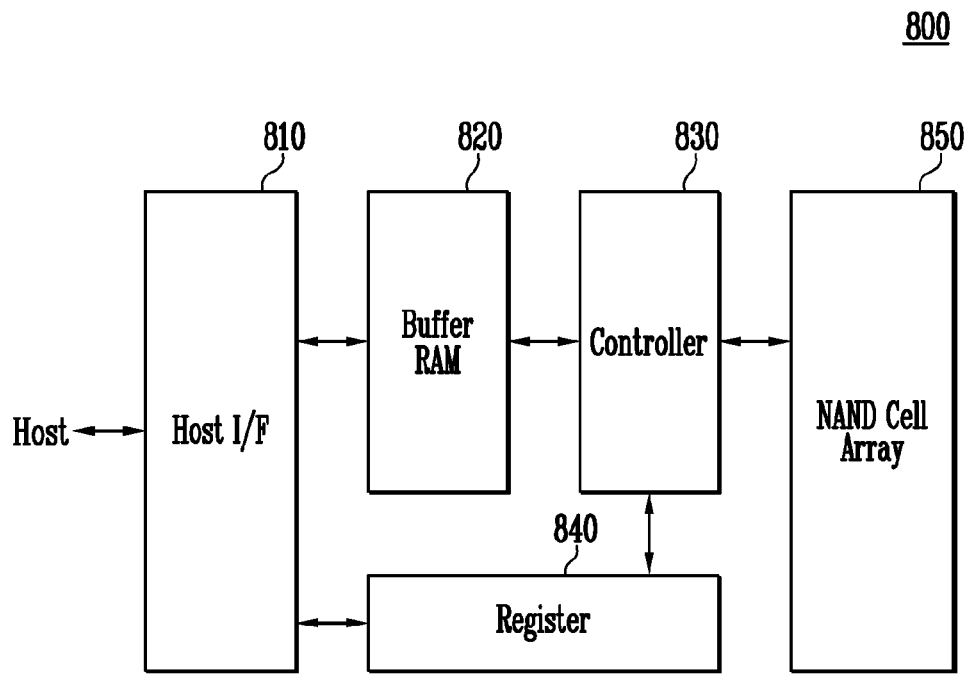
FIG. 8 is a schematic block diagram of a fusion memory device for performing a program operation according to one or more embodiments.

FIG. 8 is a schematic block diagram of a fusion memory device or a fusion memory system performing the program operation according to the aforementioned various embodiments. For example, the technical characteristics of the aforementioned embodiments are applied to an OneNAND flash memory device 800 as the fusion memory device, in some embodiments.

The OneNAND flash memory device 800 includes a host interface 810 for exchanging various information with external devices using different protocols, a buffer RAM 820 for storing code for driving a memory device or temporarily storing data, a control unit 830 for controlling reading, programming, and additional states in response to a control signal and a command input from the external devices, a register 840 for storing a command, an address, and data, such as a configuration, for defining a system operation environment inside the memory device, and a NAND flash cell array 850 formed of an operation circuit including a non-volatile memory cell and a sensing circuit.

The memory array illustrated in FIG. 2 is applied to a memory array of the NAND flash cell array 850, in some embodiments.

Figure 9:
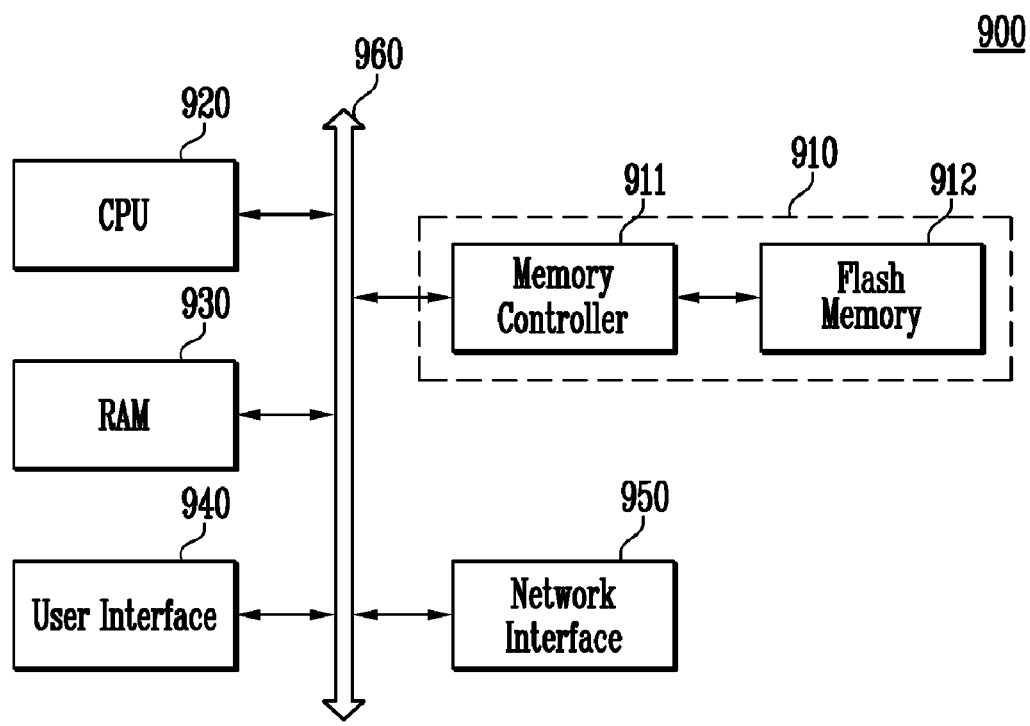
FIG. 9 is a schematic block diagram of a computing system including a flash memory device according to at least one embodiment.

FIG. 9 is a schematic block diagram of a computing system including a flash memory device 912 according at least one embodiment.

The computing system 900 includes a microprocessor 920 electrically connected to a system bus 960, a RAM 930, a user interface 940, a network interface 950, such as a baseband chipset, and a memory system 910. In some embodiments where the computing system 900 is a mobile device, a battery (not illustrated) for supplying an operation voltage of the computing system 900 is also included. In some embodiments, an application chipset, a Camera Image Processor (CIS), a mobile dynamic random access memory (DRAM), or other suitable circuitry are further included in the computing system 900 according. The memory system 910 configures, for example, a Solid State Drive/Disk (SSD) using a non-volatile memory for storing data, in some embodiments. In some embodiments, the memory system 910 is provided as a fusion flash memory (for example, an OneNAND flash memory).

As described above, the embodiments described in the drawings and the specification use specific terms for purposes of illustration, and do not limit the scope of the present description. Accordingly, those skilled in the art will appreciate that various modifications and another equivalent example may be made without departing from the scope and spirit of the present description. Therefore, the sole technical protection scope of the present description will be defined by the technical spirit of the accompanying claims.

What is claimed is:

1. A semiconductor device, comprising:
a memory block, the memory block including memory cells coupled to bit lines;
a first sensing circuit
coupled to an even bit line among the bit lines, and
configured to sense current flow through the even bit line in response to an even bit line control signal and an even discharge signal; and
a second sensing circuit
coupled to an odd bit line among the bit lines, and
configured to sense the current flow through the odd bit line in response to an odd bit line control signal and an odd discharge signal,
wherein the first sensing circuit and second sensing circuit are configured
to supply a ground voltage to the odd bit line when sensing the current flow through the even bit line, and
to supply the ground voltage to the even bit line when sensing the current flow through the odd bit line,
wherein
the first sensing circuit comprises a first activation control circuit configured to selectively couple the first sensing circuit to the even bit line in response to a first activation control signal, and
the second sensing circuit comprises a second activation control circuit configured to selectively couple the second sensing circuit to the odd bit line in response to a second activation control signal, and
wherein the first activation control signal is the same as the second activation control signal.

2. The semiconductor device of claim 1, wherein the first sensing circuit and the second sensing circuit are configured to perform a read operation by a current sensing method.

3. The semiconductor device of claim 1, wherein the first sensing circuit comprises:
a bit line clamp circuit configured to control a voltage of the even bit line in response to the even bit line control signal;
a discharge circuit configured to discharge the even bit line in response to the even discharge signal; and
a current sensing unit configured to precharge the even bit line or supply current to the even bit line, and sense current flow through the even bit line.

4. The semiconductor device of claim 3, wherein the first sensing circuit further comprise:
an activation control circuit configured to activate the first sensing circuit in response to an activation signal.

5. The semiconductor device of claim 1, wherein the second sensing circuit comprises:
a bit line clamp circuit configured to control a voltage of the odd bit line in response to the odd bit line control signal;
a discharge circuit configured to discharge the odd bit line in response to the odd discharge signal; and
a current sensing unit configured to precharge the odd bit line or supply current to the odd bit line, and sense current flow through the odd bit line.

6. The semiconductor device of claim 5, wherein the second sensing circuit further comprises:
an activation control circuit configured to activate the second sensing circuit in response to an activation signal.

7. The semiconductor device of claim 3, wherein the current sensing unit comprises:
a first sensing node;
a second sensing node;
an isolation circuit between the first sensing node and the second sensing node, the isolation circuit configured to selectively connect the first sensing node and the second sensing node in response to an isolation signal; and
a latch circuit, wherein an output of the latch circuit is configured to output the isolation signal.

8. The semiconductor device of claim 7, wherein the current sensing unit further comprises a precharge circuit configured to precharge the first sensing node and the second sensing node in response to a precharge signal.

9. The semiconductor device of claim 7, wherein the current sensing unit further comprises a current determination circuit configured to receive the first sensing node at an input and output the even discharge signal.

10. The semiconductor device of claim 7, wherein the latch circuit comprises:
a first inverter configured to output the even discharge signal; and
a second inverter configured
to receive the even discharge signal, and
to output the isolation signal, wherein the first inverter is configured to receive the isolation signal.

11. The semiconductor device of claim 1, further comprising a selection circuit configured
to activate the first sensing circuit and the second sensing circuit, and
to receive information from the first sensing circuit and the second sensing circuit regarding data stored in the memory cells.

12. The semiconductor device of claim 1, further comprising a control circuit configured to generate an operation control signal,
wherein
the first sensing circuit is configured to precharge the even bit line in response to the operation control signal, and
the second sensing circuit is configured to precharge the odd bit line in response to the operation control signal.

13. A method of operating a semiconductor device, the method comprising:
discharging odd bit lines of odd memory cells among memory cells connected between a source line and bit lines;

performing a first sensing operation for sensing current flow to the source line from even bit lines of even memory cells among the memory cells;

discharging the even bit lines of the even memory cells;

performing a second sensing operation for sensing current flow to the source line from the odd bit lines of odd memory cells among the memory cells; and charging a sensing node to a target level before performing the first sensing operation, wherein the first sensing operation comprises connecting the sensing node and the even bit line for a duration of time, and wherein the duration of time is determined according to a level of a threshold voltage of an even memory cell desired to be detected.

14. A method of operating a semiconductor device, the method comprising:

discharging odd bit lines of odd memory cells among memory cells connected between a source line and bit lines;

performing a first sensing operation for sensing current flow to the source line from even bit lines of even memory cells among the memory cells;

discharging the even bit lines of the even memory cells;

performing a second sensing operation for sensing current flow to the source line from the odd bit lines of odd memory cells among the memory cells; and charging a sensing node to a target level before performing the second sensing operation, wherein the second sensing operation comprises connecting the sensing node and the odd bit line for a duration of time, and wherein the duration of time is determined according to a level of a threshold voltage of an odd memory cell desired to be detected.

* * * * *